US010896901B2

(12) United States Patent
Nakamura et al.

(10) Patent No.: US 10,896,901 B2
(45) Date of Patent: Jan. 19, 2021

(54) METHOD OF MANUFACTURING SEMICONDUCTOR DEVICE, AND MOUNTING DEVICE

(71) Applicant: SHINKAWA LTD., Tokyo (JP)

(72) Inventors: Tomonori Nakamura, Tokyo (JP); Toru Maeda, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 1 day.

(21) Appl. No.: 16/337,926

(22) PCT Filed: Sep. 28, 2017

(86) PCT No.: PCT/JP2017/035323
§ 371 (c)(1),
(2) Date: Jun. 17, 2019

(87) PCT Pub. No.: WO2018/062423
PCT Pub. Date: Apr. 5, 2018

(65) Prior Publication Data
US 2019/0312020 A1 Oct. 10, 2019

(30) Foreign Application Priority Data
Sep. 30, 2016 (JP) .................................. 2016-194945

(51) Int. Cl.
H01L 25/07 (2006.01)
H01L 21/44 (2006.01)
(Continued)

(52) U.S. Cl.
CPC .............. H01L 25/50 (2013.01); H01L 24/73 (2013.01); H01L 24/75 (2013.01); H01L 24/81 (2013.01);
(Continued)

(58) Field of Classification Search
CPC ............. H01L 25/0657; H01L 23/3135; H01L 23/544; H01L 25/50; H01L 24/97
See application file for complete search history.

(56) References Cited

U.S. PATENT DOCUMENTS

| 2005/0176178 A1* | 8/2005 | Takahashi | H01L 21/565 438/123 |
| 2013/0026643 A1* | 1/2013 | England | H01L 22/10 257/774 |
| 2016/0141273 A1* | 5/2016 | Tsuji | H01L 24/97 257/737 |

FOREIGN PATENT DOCUMENTS

| JP | 2013021058 | 1/2013 |
| JP | 2013080758 | 5/2013 |
| JP | 2014060241 | 4/2014 |

OTHER PUBLICATIONS

"International Search Report (Form PCT/ISA/210) of PCT/JP2017/035323," dated Dec. 26, 2017, with English translation thereof, pp. 1-2.

* cited by examiner

Primary Examiner — Brian Turner
(74) Attorney, Agent, or Firm — JCIPRNET

(57) ABSTRACT

The disclosure is provided with: a temporary crimping step in which one or more semiconductor chips 10 are sequentially laminated while being temporarily crimped in each of two or more locations on a substrate 30 to thereby form chip stacks ST in a temporarily crimped state; and a permanent crimping step in which the top surfaces of all of the chip stacks ST formed in the temporarily crimped state are sequentially heated, pressurized, and permanently crimped. Furthermore, a specifying step is provided prior to the temporary crimping step for specifying a separation distance Dd which is the distance from the chip stacks ST under permanent crimping to a location at which the temperature (Continued)

of the substrate 30, the temperature having been raised by heating for the permanent crimping, becomes less than or equal to a prescribed permissible temperature Td, and in the temporary crimping step, the chip stacks ST in the temporarily crimped state are formed separated from each other by the separation distance Dd or more.

8 Claims, 8 Drawing Sheets

(51) Int. Cl.
*H01L 21/50* (2006.01)
*H01L 21/56* (2006.01)
*H01L 25/065* (2006.01)
*H01L 23/31* (2006.01)
*H01L 25/00* (2006.01)
*H01L 23/00* (2006.01)
*H01L 25/18* (2006.01)

(52) U.S. Cl.
CPC .............. *H01L 24/83* (2013.01); *H01L 24/92* (2013.01); *H01L 25/065* (2013.01); *H01L 25/07* (2013.01); *H01L 25/18* (2013.01); *H01L 2224/16145* (2013.01); *H01L 2224/73204* (2013.01); *H01L 2224/7555* (2013.01); *H01L 2224/7565* (2013.01); *H01L 2224/75252* (2013.01); *H01L 2224/81203* (2013.01); *H01L 2224/81986* (2013.01); *H01L 2224/83203* (2013.01); *H01L 2224/83986* (2013.01); *H01L 2224/92143* (2013.01)

| Thickness / Material | * | * | *** |
|---|---|---|---|
| *** | High | High | Low |
| *** | High | Medium | Low |
| ⋮ | ⋮ | ⋮ | ⋮ |
| *** | Medium | Medium | Low |

FIG. 9

METHOD OF MANUFACTURING SEMICONDUCTOR DEVICE, AND MOUNTING DEVICE

CROSS-REFERENCE TO RELATED APPLICATION

This application is a 371 application of the International PCT application serial no. PCT/JP2017/035323, filed on Sep. 28, 2017, which claims the priority benefit of Japan Patent Application No. 2016-194945, filed on Sep. 30, 2016. The entirety of each of the abovementioned patent applications is hereby incorporated by reference herein and made a part of this specification.

BACKGROUND

Technical Field

The disclosure relates to a method of manufacturing a semiconductor device in which one or more semiconductor chips are laminated and mounted in a plurality of locations on a substrate and relates to a mounting device for mounting semiconductor chips on a substrate.

Description of Related Art

Conventionally, there has been a demand for higher performance and further miniaturization of semiconductor devices. Therefore, in some cases, it has been proposed to laminate and mount a plurality of semiconductor chips. Usually, bumps and a non-conductive film (hereinafter referred to as the "NCF") covering the bumps are provided on one surface of the semiconductor chip. The NCF is made of a thermosetting resin, and the NCF reversibly softens with a temperature rise below a predetermined curing start temperature but irreversibly cures with a temperature rise above the curing start temperature. In order to laminate and mount such semiconductor chips, the following has been proposed: a plurality of semiconductor chips are laminated while being temporarily crimped to form a chip stack in the temporarily crimped state, and then the chip stack in the temporarily crimped state is heated and pressurized to be permanently crimped. Further, in the temporary crimping, the semiconductor chips are heated and pressurized at a temperature at which the NCF softens. Furthermore, in the permanent crimping, the chip stack is heated and pressurized at a temperature at which the bumps of all of the plurality of semiconductor chips forming the chip stack are melted and the NCF cures.

Such a lamination technique is disclosed, for example, in Patent Document 1. In Patent Document 1, a thermosetting adhesive film is laminated in advance on a bump forming surface of a semiconductor chip. At the time of laminating and mounting, first, a plurality of semiconductor chips are sequentially laminated on a substrate or another semiconductor chip while being temporarily crimped to form a multistage temporarily crimped laminate body. Next, by pressurizing and heating this multistage temporarily crimped laminate body from the upper side, a permanent crimping step of melting the bumps and curing the thermosetting adhesive film is performed. According to such a technique, since a larger number of semiconductor chips can be mounted in a small area, much higher performance and further miniaturization can be achieved.

RELATED ART

Patent Document

[Patent Document 1] Japanese Laid-open No. 2014-60241

SUMMARY

Technical Problem

Incidentally, generally, a plurality of chip stacks are mounted on one substrate. In the case of mounting a plurality of chip stacks, a technique has been proposed in part for forming a plurality of chip stacks in the temporarily crimped state and then permanently crimping the plurality of chip stacks in the temporarily crimped state. In this case, the number of times of switching between the temporary crimping process and the permanent crimping process can be reduced compared with the case where the temporary crimping and the permanent crimping of one chip stack are completed and then the temporary crimping and the permanent crimping of the next chip stack are performed. Therefore, the mounting step can be further simplified and shortened.

On the other hand, in the case of the technique of performing permanent crimping after forming a plurality of chip stacks in the temporarily crimped state, the heat applied to one chip stack for the permanent crimping may be transferred to other chip stacks in the temporarily crimped state in the vicinity. In particular, when the thermal conductivity of the substrate is high, the heat applied to one chip stack for permanent crimping is transferred to other chip stacks in the temporarily crimped state in the vicinity with high efficiency. In this case, there is a concern that in a semiconductor chip located in a lower layer of a chip stack in the vicinity, an undesirable thermal change such as the curing of the NCF or the melting of the bumps may occur. When the curing of the NCF and the melting of the bumps occur prior to the permanent crimping, the proper bonding between the semiconductor chip and the substrate is impeded.

In order to prevent such an unintended thermal change, it is also conceivable to set a lower heating temperature in the permanent crimping. However, in the case where the heating temperature is set to a lower temperature, there is a concern that heating to the lower layer of the chip stack cannot be performed sufficiently and that a bonding failure may occur.

Therefore, in the disclosure, an object is to provide a method of manufacturing a semiconductor device and a mounting device which can, in the case of performing the permanent crimping after forming two or more chip stacks in the temporarily crimped state, prevent an undesirable thermal change in the chip stacks in the vicinity of the chip stack under permanent crimping.

Solution to the Problem

A method of manufacturing a semiconductor device of the disclosure is a method of manufacturing a semiconductor device in which one or more semiconductor chips are laminated and mounted in a plurality of locations on a substrate, including: a temporary crimping step of sequentially laminating the one or more semiconductor chips in each of two or more locations on the substrate while temporarily crimping the one or more semiconductor chips to thereby form chip stacks in a temporarily crimped state; and a permanent crimping step of sequentially heating and pressurizing top surfaces of all of the chip stacks formed in the temporarily crimped state to thereby collectively permanently crimp the one or more semiconductor chips which form each of the chip stacks, wherein the method repeats the temporary crimping step and the permanent crimping step twice or more until a desired number of the chip stacks are reached, further includes a specifying step prior to the temporary crimping step for specifying a separation distance which is a distance from the chip stacks under permanent crimping to a location at which a temperature of the substrate, the temperature having been raised by heating for the permanent crimping, becomes less than or equal to a prescribed permissible temperature, in the temporary crimping step, forms the chip stacks in the temporarily crimped state to be separated from each other by the separation distance or more, and in the permanent crimping step, permanently crimps the chip stacks which are in the temporarily crimped state and are formed separated from each other by the separation distance or more.

In a preferred aspect, the specifying step specifies the separation distance based on mounting conditions of the semiconductor chips. In this case, the mounting conditions include at least a lower layer temperature which is a temperature of lowermost layers of the chip stacks when the permanent crimping step is performed, and in the specifying step, the separation distance is specified so that the separation distance becomes greater as the lower layer temperature is greater.

In another preferred aspect, a thermosetting resin is provided on an end surface at one side of the semiconductor chip in a laminating direction for fixing the semiconductor chip to the substrate or to another semiconductor chip mounted adjacent to the one side in the laminating direction, and the permissible temperature is less than a curing start temperature at which the thermosetting resin starts to cure irreversibly.

In another effective aspect, a map forming step of forming a map indicating formation positions of the plurality of chip stacks based on the specified separation distance is further included, wherein in the temporary crimping step, the plurality of chip stacks in the temporarily crimped state are formed according to the map.

In another preferred aspect, the following is further included: a plurality of disposition regions in which the chip stacks are disposed are set to be arranged in a lattice shape at a prescribed pitch P on the substrate, and the specifying step, after specifying the separation distance and when setting the separation distance as Dd, further specifies an integer N satisfying $\{(N-1) \times P\} \leq Dd < N \times P$, and in the temporary crimping step, the chip stacks in the temporarily crimped state are formed with N disposition regions therebetween.

In another preferred aspect, the substrate is a semiconductor wafer.

Another method of manufacturing a semiconductor device of the disclosure is including: a temporary crimping step of sequentially laminating one or more semiconductor chips in each of two or more locations on a substrate while temporarily crimping the one or more semiconductor chips to thereby form chip stacks in a temporarily crimped state; and a permanent crimping step of repeating twice or more a process of simultaneously heating and pressurizing top surfaces of the two or more chip stacks in the temporarily crimped state and simultaneously performing permanent crimping to change all of the chip stacks in the temporarily crimped state formed in the temporary crimping step to a permanently crimped state, wherein the method repeats the temporary crimping step and the permanent crimping step twice or more until a desired number of the chip stacks are reached, further includes a specifying step prior to the temporary crimping step for specifying a separation distance which is a distance from the chip stacks under permanent crimping to a location at which a temperature of the substrate, the temperature having been raised by heating for the permanent crimping, becomes less than or equal to a prescribed permissible temperature, and in the temporary crimping step, forms the chip stacks in the temporarily crimped state not to be permanently crimped simultaneously to be separated from each other by the separation distance or more.

Another mounting device of the disclosure is a mounting device for laminating and mounting one or more semiconductor chips in a plurality of locations on a substrate, including: a temporary crimping means of sequentially laminating the one or more semiconductor chips in each of two or more locations on the substrate while temporarily crimping the one or more semiconductor chips to thereby form chip stacks in a temporarily crimped state; a permanent crimping means of sequentially heating and pressurizing top surfaces of all of the chip stacks formed in the temporarily crimped state to thereby collectively permanently crimp the one or more semiconductor chips which form each of the chip stacks; and a separation distance specifying means for specifying a separation distance prior to the temporary crimping, the separation distance being a distance from the chip stacks under permanent crimping to a location at which a temperature of the substrate, the temperature having been raised by heating for the permanent crimping, becomes less than or equal to a prescribed permissible temperature, wherein the temporary crimping means forms the chip stacks in the temporarily crimped state to be separated from each other by the separation distance or more, and the permanent crimping means permanently crimps the chip stacks which are in the temporarily crimped state and are formed separated from each other by the separation distance or more.

Another mounting device of the disclosure is a mounting device for laminating and mounting one or more semiconductor chips in a plurality of locations on a substrate, including: a bonding part for sequentially laminating the one or more semiconductor chips in each of two or more locations on the substrate while temporarily crimping the one or more semiconductor chips to thereby form chip stacks in a temporarily crimped state and for sequentially heating and pressurizing top surfaces of all of the chip stacks formed in the temporarily crimped state to thereby collectively permanently crimp the one or more semiconductor chips which form each of the chip stacks; a separation distance specifying means for specifying a separation distance prior to the temporary crimping, the separation distance being a distance from the chip stacks under permanent crimping to a location at which a temperature of the substrate, the temperature having been raised by heating for the permanent crimping, becomes less than or equal to a prescribed permissible temperature; and a control part for controlling the bonding part so that after the chip stacks in the temporarily crimped state are formed separated from each other by the separation distance or more, the chip stacks formed in the temporarily crimped state are permanently crimped.

Effects

According to the disclosure, since there are no chip stacks in the temporarily crimped state in the vicinity of the chip stack under permanent crimping, an undesirable thermal change in the chip stacks caused by the heat of the permanent crimping can be prevented.

BRIEF DESCRIPTION OF THE DRAWINGS

FIG. 9 is a diagram showing an example of heat transfer property data.

DESCRIPTION OF THE EMBODIMENTS

Figure 1:
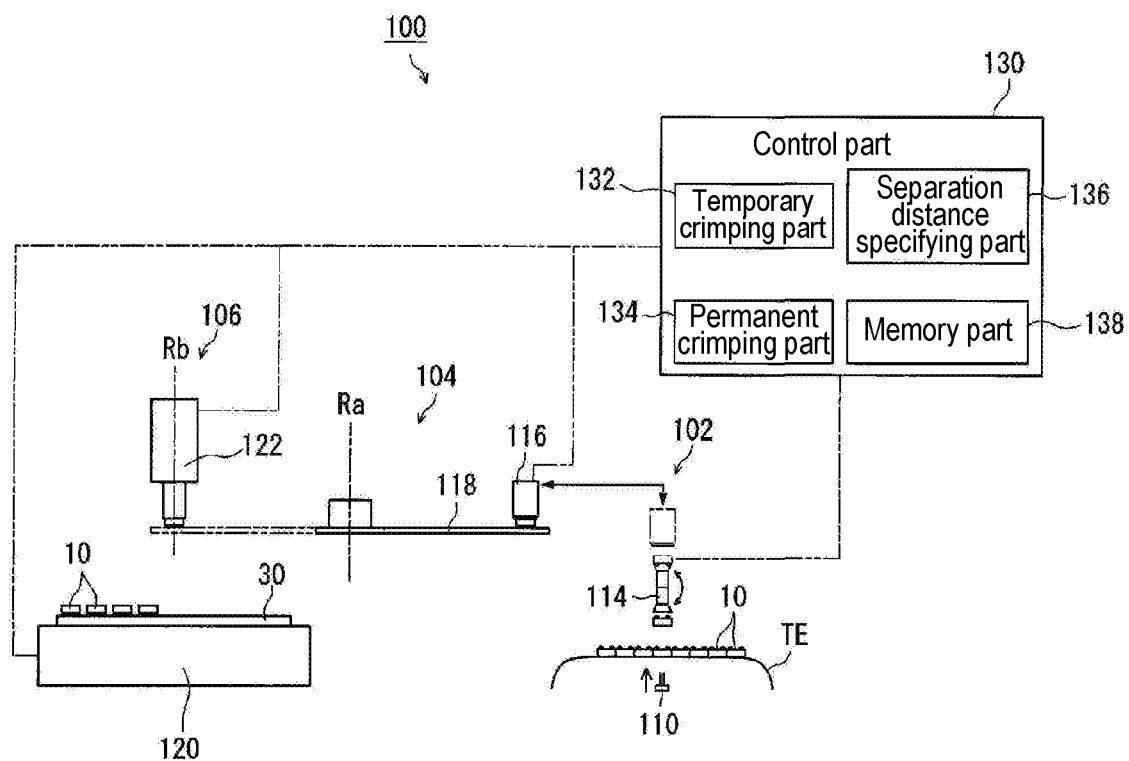
FIG. 1 is a schematic diagram of a configuration of a mounting device according to an embodiment of the disclosure.

Hereinafter, an embodiment of the disclosure will be described with reference to the drawings. FIG. 1 is a schematic diagram of a configuration of a mounting device 100 according to an embodiment of the disclosure. The mounting device 100 is a device for mounting a semiconductor chip 10 on a substrate 30. The mounting device 100 is configured to be particularly suitable for laminating and mounting a plurality of semiconductor chips 10.

The mounting device 100 includes a chip supplying part 102, a chip transporting part 104, a bonding part 106, and a control part 130 for controlling the driving of these components. The chip supplying part 102 is a part for taking out the semiconductor chip 10 from a chip supply source and supplying the semiconductor chip 10 to the chip transporting part 104. The chip supplying part 102 includes a protrusion part 110, a die picker 114, and a transfer head 116.

In the chip supplying part 102, the plurality of semiconductor chips 10 are placed on a dicing tape TE. At this time, the semiconductor chips 10 are placed in a face-up state in which bumps 18 face upward. The protrusion part 110 pushes up only one semiconductor chip 10 out of the plurality of semiconductor chips 10 in the face-up state at it is. The die picker 114 sucks and holds the semiconductor chip 10 pushed up by the protrusion part 110 at its lower end to receive the semiconductor chip 10. The die picker 114 that has received the semiconductor chip 10 rotates 180 degrees in situ so that the bumps 18 of the semiconductor chip 10 face downward, that is, so that the semiconductor chip 10 becomes to be in a face-down state. Once in this state, the transfer head 116 receives the semiconductor chip 10 from the die picker 114.

The transfer head 116 can move in the vertical and horizontal directions and can suck and hold the semiconductor chip 10 at its lower end. When the die picker 114 rotates 180 degrees and the semiconductor chip 10 becomes to be in the face-down state, the transfer head 116 sucks and holds the semiconductor chip 10 at its lower end. Thereafter, the transfer head 116 moves in the horizontal and vertical directions to move to the chip transporting part 104.

The chip transporting part 104 has a rotating table 118 which rotates with a vertical rotation axis Ra as the center. The transfer head 116 places the semiconductor chip 10 at a predetermined position of the rotating table 118. The rotating table 118 on which the semiconductor chip 10 is placed rotates with the rotation axis Ra as the center, whereby the semiconductor chip 10 is transported to the bonding part 106 located on the opposite side of the chip supplying part 102.

The bonding part 106 includes a stage 120 for supporting the substrate 30 and a mounting head 122 for holding the semiconductor chip 10 and installing it on the substrate 30. The stage 120 is movable in the horizontal direction and adjusts the relative positional relationship between the substrate 30 placed thereon and the mounting head 122. In addition, a heater may be incorporated in the stage 120.

The mounting head 122 can hold the semiconductor chip 10 at its lower end and can rotate and can rise and descend around a vertical rotation axis Rb. The mounting head 122 crimps the semiconductor chip 10 onto the substrate 30 placed on the stage 120 or onto another semiconductor chip 10. Specifically, the mounting head 122 descends so as to press the held semiconductor chip 10 onto the substrate 30 or the like, whereby temporary crimping or permanent crimping of the semiconductor chip 10 is performed. A variable temperature heater is incorporated in the mounting head 122, and the mounting head 122 is heated to a first temperature T1 (to be described later) when performing the temporary crimping and is heated to a second temperature T2 greater than the first temperature T1 when performing the permanent crimping. In addition, the mounting head 122 applies a first load F1 to the semiconductor chip 10 when performing the temporary crimping and applies a second load F2 to the semiconductor chip 10 when performing the permanent crimping.

A camera (not shown) is provided in the vicinity of the mounting head 122. The substrate 30 and the semiconductor chip 10 are each provided with an alignment mark as a reference for positioning. The camera images the substrate 30 and the semiconductor chip 10 so that the alignment marks are reflected. The control part 130 grasps the relative positional relationship between the substrate 30 and the semiconductor chip 10 based on the image data obtained by this imaging and adjusts the rotation angle of the mounting head 122 around the rotation axis Rb and the horizontal position of the stage 120 according to the needs.

The control part 130 controls the driving of each part and includes, for example, a CPU which performs various calculations and a memory part 138 which stores various data and programs. The control part 130 functions as a temporary crimping part 132, a permanent crimping part 134, and a separation distance specifying part 136 by reading programs from the memory part 138. The temporary crimping part 132 drives the bonding part 106 to sequentially laminate one or more semiconductor chips while temporarily crimping them to form a chip stack in a temporarily crimped state. The permanent crimping part 134 drives the bonding part 106 and heats and pressurizes a top surface of the chip stack formed in the temporarily crimped state, thereby collectively permanently crimping the one or more semiconductor chips which form each chip stack. The separation distance specifying part 136 specifies a separation distance prior to the temporary crimping. The separation distance, which will be described in detail later, is a separation distance of the chip stack in the temporarily crimped state, which is necessary for well laminating the semiconductor chips 10.

In addition, the configuration of the mounting device 100 described here is an example and may be changed as appropriate. For example, in the embodiment, both the temporary crimping and the permanent crimping are performed by one mounting head 122, but a mounting head for the temporary crimping and a mounting head for the permanent crimping may be provided. Further, in the embodiment, the stage 120 is configured to move horizontally, but the mounting head 122 may be configured to move horizontally instead of or in addition to the stage 120. In addition, the configurations of the chip supplying part 102, the chip transporting part 104 and the like may be changed as appropriate.

Figure 2:
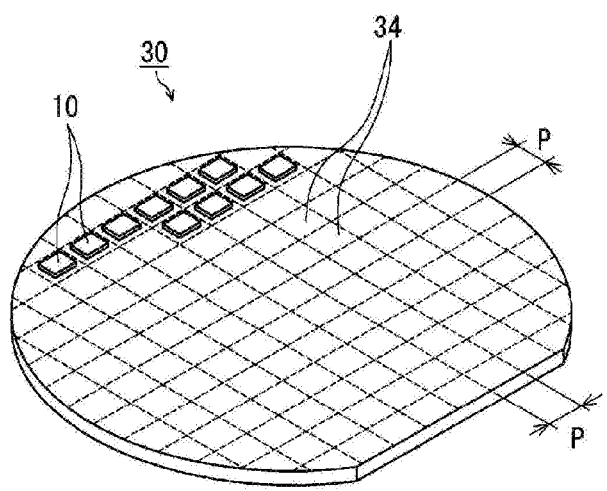
FIG. 2 is a schematic perspective diagram of a semiconductor wafer functioning as a substrate.

Next, mounting of the semiconductor chip 10 by the mounting device 100 (manufacturing of a semiconductor device) will be described. In the embodiment, a semiconductor wafer is used as the substrate 30, and a plurality of semiconductor chips 10 are laminated and mounted on the semiconductor wafer (the substrate 30). Therefore, the mounting process of the embodiment is a "chip-on-wafer process" in which the semiconductor chips 10 are laminated and mounted on a circuit forming surface of the semiconductor wafer. FIG. 2 is a schematic image diagram of the substrate 30 (the semiconductor wafer) used in the embodiment. The substrate 30, which is a semiconductor wafer, is mainly made of silicon and has a high thermal conductivity compared with a general circuit board made of resin. As shown in FIG. 2, a plurality of disposition regions 34 arranged in a lattice shape are set on the substrate 30. The plurality of semiconductor chips 10 are laminated and mounted in each of the disposition regions 34. The disposition regions 34 are disposed at a predetermined disposition pitch P. The value of the disposition pitch P is appropriately set according to the size and the like of the semiconductor chip 10 as the mounting object. Further, in the embodiment, the disposition regions 34 are in a substantially square shape, but they may be in other shapes as appropriate, such as a substantially rectangular shape.

Figure 3:
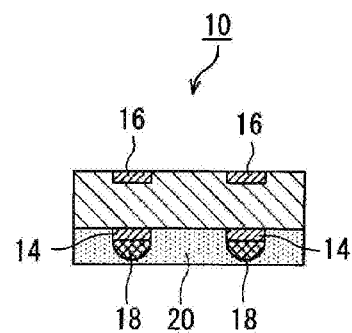
FIG. 3 is a diagram showing a configuration of a semiconductor chip to be mounted.

Next, a configuration of the semiconductor chip 10 will be briefly described. FIG. 3 is a diagram showing a schematic configuration of the semiconductor chip 10 to be mounted. Electrode terminals 14 and 16 are formed on top and bottom surfaces of the semiconductor chip 10. In addition, the bumps 18 are formed on one surface of the semiconductor chip 10 continuously to the electrode terminals 14. The bumps 18 are made of a conductive metal and melt at a predetermined melting temperature Tm.

Further, a non-conductive film (hereinafter referred to as the "NCF") 20 is attached to one surface of the semiconductor chip 10 so as to cover the bumps 18. The NCF 20 functions as an adhesive for bonding the semiconductor chip 10 to the substrate 30 or to another semiconductor chip 10 and is a non-conductive thermosetting resin, such as polyimide resin, epoxy resin, acrylic resin, phenoxy resin, polyethersulfone resin and the like. The thickness of the NCF 20 is greater than the average height of the bumps 18, and the bumps 18 are substantially completely covered by the NCF 20. The NCF 20 is a solid film at normal temperature, but the NCF 20 gradually and reversibly softens when it exceeds a predetermined softening start temperature Ts and exhibits fluidity, and the NCF 20 starts to irreversibly cure when it exceeds a predetermined curing start temperature Tt.

Here, the softening start temperature Ts is less than the melting temperature Tm of the bumps 18 and the curing start temperature Tt. The first temperature T1 for temporary crimping is greater than the softening start temperature Ts and less than the melting temperature Tm and the curing start temperature Tt. Further, the second temperature T2 for permanent crimping is greater than the melting temperature Tm and the curing start temperature Tt. That is, Ts<T1<(Tm, Tt)<T2.

When the semiconductor chip 10 is being temporarily crimped to the substrate 30 or the lower semiconductor chip 10 (hereinafter referred to as the "crimped body"), the mounting head 122 is heated to the first temperature T1 and then pressurizes the semiconductor chip 10. At this time, the NCF 20 of the semiconductor chip 10 is heated to the vicinity of the first temperature T1 by the heat transfer from the mounting head 122, softens, and possesses fluidity. Then, in this way, the NCF 20 can flow into a gap between the semiconductor chip 10 and the crimped body and can securely fill the gap.

When the semiconductor chip 10 is being permanently crimped to the crimped body, the mounting head 122 is heated to the second temperature T2 and then pressurizes the semiconductor chip 10. At this time, the bumps 18 and the NCF 20 of the semiconductor chip 10 are heated to the vicinity of the second temperature T2 by the heat transfer from the mounting head 122. In this way, the bumps 18 can be melted and welded to the opposite crimped body. Further, since the NCF 20 cures in the state of filling the gap between the semiconductor chip 10 and the crimped body by this heating, the semiconductor chip 10 and the crimped body are firmly fixed.

Figure 4:
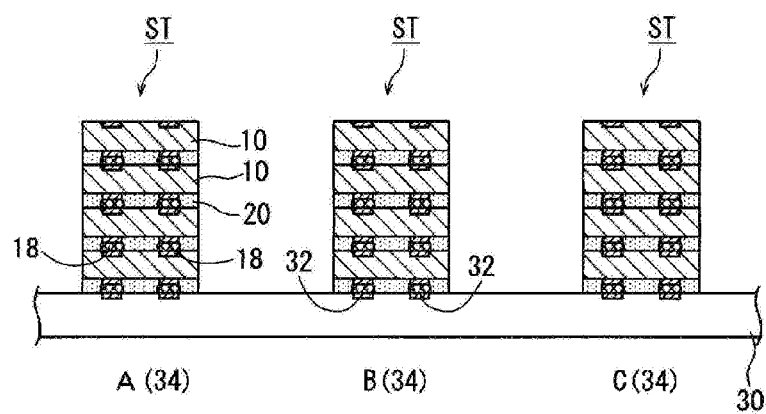
FIG. 4 is a diagram showing a configuration of a semiconductor device.

Next, a semiconductor device manufactured by laminating and mounting the semiconductor chips 10 will be described. FIG. 4 is a diagram showing a configuration of a semiconductor device in which the plurality of semiconductor chips 10 are laminated and mounted on the substrate 30. The semiconductor device is configured by laminating and mounting a target lamination number of semiconductor chips 10 in each of the plurality of disposition regions 34. In the embodiment, the target lamination number is "4", and four semiconductor chips 10 are laminated and mounted in one disposition region 34. Hereinafter, a thing in which four semiconductor chips 10 have been laminated and mounted is called a "chip stack ST."

A target lamination number of the semiconductor chips are sequentially laminated while being temporarily crimped to form a chip stack ST in the temporarily crimped state, and then a top surface of the chip stack ST is pressurized while being heated at the second temperature T2 to be permanently crimped, whereby the chip stack ST is formed. Then, a procedure for forming a plurality of such chip stacks ST includes a way in which the temporary crimping and the permanent crimping of one chip stack ST are completed and then the temporary crimping and the permanent crimping of the next chip stack ST are performed (hereinafter referred to as a "serial method") and a way in which the temporary crimping of a plurality of chip stacks ST is performed and then the permanent crimping of the plurality of chip stacks ST is performed (hereinafter referred to as a "parallel method"). Since the parallel method continuously performs the permanent crimping after continuously performing the temporary crimping, compared with the serial method which repeats the temporary crimping and the permanent crimping alternately, the number of times of switching the temperature of the mounting head 122 or the like can be greatly reduced. By reducing the number of times of switching the temperature, the standby time for temperature rise and fall of the mounting head 122 can be reduced, and the processing time of the entire mounting process can be reduced.

Therefore, a plurality of chip stacks ST are also formed by the parallel method in the embodiment. However, in the case of the parallel method, when one chip stack ST is being permanently crimped, other chip stacks ST in the temporarily crimped state may be present in the vicinity thereof. In this case, the heat for permanent crimping may adversely affect other chip stacks ST in the temporarily crimped state in the vicinity. Therefore, in the embodiment, the chip stacks ST in the temporarily crimped state are formed separated from each other by a predetermined separation distance Dd or more. Next, a flow of mounting the semiconductor chips 10 in the embodiment will be described.

Figure 5:
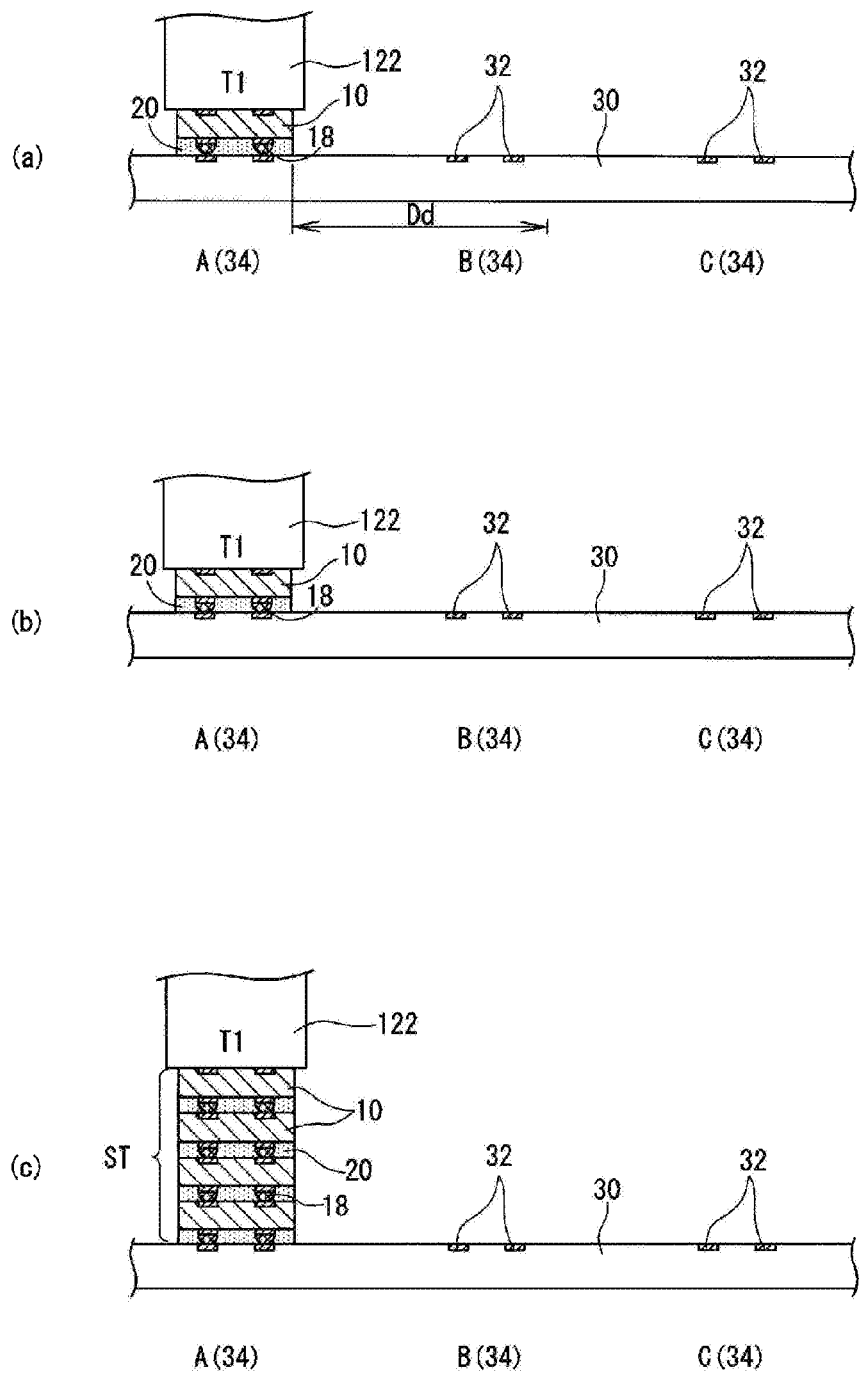
FIG. 5 is a diagram showing a flow of laminating and mounting a plurality of semiconductor chips.
Figure 6:
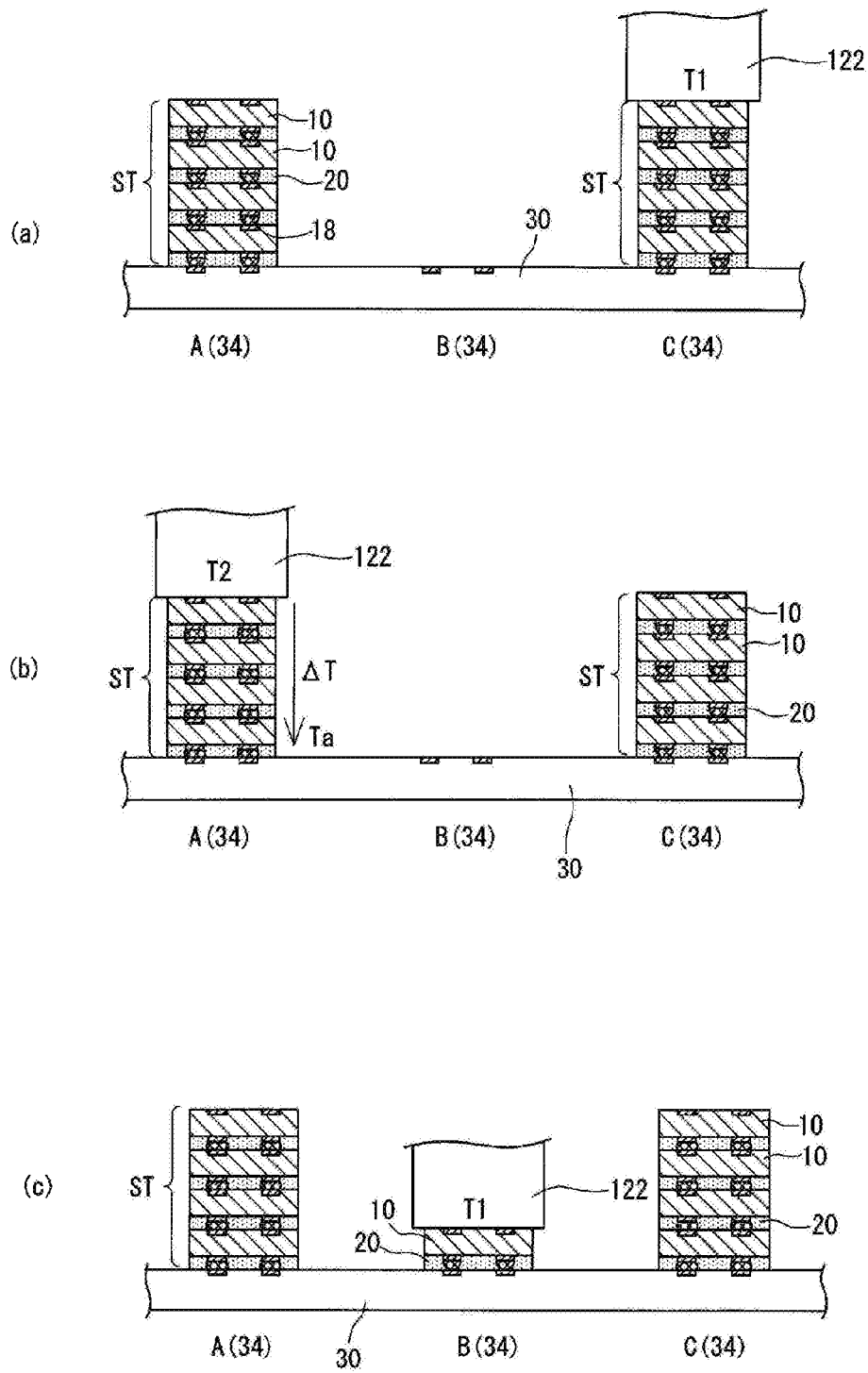
FIG. 6 is a diagram showing a flow of laminating and mounting a plurality of semiconductor chips.

FIGS. 5 and 6 are image diagrams showing a flow of mounting the semiconductor chips 10. Three disposition regions 34 are illustrated in FIGS. 5 and 6, and for convenience of description, these are referred to as a region A, a region B, and a region C in order from the left side. Further, in the example of FIGS. 5 and 6, the separation distance Dd is substantially the same as the disposition pitch P of the disposition regions 34. Furthermore, the mounting procedure described below may be performed under normal pressure or may be performed in a vacuum to prevent inclusion of air bubbles and the like.

In the embodiment, a temporary crimping step of forming two or more chip stacks ST in the temporarily crimped state and a permanent crimping step of permanently crimping the two or more chip stacks ST sequentially are repeated to mount the plurality of chip stacks ST.

Specifically speaking, first, at the beginning, as shown in (a) of FIG. 5, the mounting head 122 is used to dispose the semiconductor chip 10 in the region A on the substrate 30. At this time, the substrate 30 is positioned with respect to the semiconductor chip 10 so that the bumps 18 of the semiconductor chip 10 face electrode terminals 32 on the substrate 30. In addition, at this time, the mounting head 122 is heated to the first temperature T1 which is the temperature for temporary crimping. Next, as shown in (b) of FIG. 5, the semiconductor chip 10 is pressurized with the prescribed first load F1 by the mounting head 122, and the semiconductor chip 10 is temporarily crimped to the substrate 30. At this time, the NCF 20 is heated to the softening start temperature Ts or more by the heat transfer from the mounting head 122 and exhibits appropriate fluidity. In this way, the NCF 20 fills the gap between the semiconductor chip 10 and the substrate 30 without any gap. In addition, the first load F1 is not particularly limited as long as the amount of the first load F1 allows the bumps 18 to contact the electrode terminals 32 of the substrate 30 by pushing away the softened NCF 20 without significantly deforming the bumps 18.

When the first-layer semiconductor chip 10 can be temporarily crimped, then the second-layer semiconductor chip 10 is further temporarily crimped onto the temporarily crimped first-layer semiconductor chip 10. When the second-layer semiconductor chip 10 is being temporarily crimped, the same as the case in the first-layer semiconductor chip 10, the mounting head 122 is used to dispose the second-layer semiconductor chip 10 on the first-layer semiconductor chip 10 so that the bumps 18 of the second-layer semiconductor chip 10 face the electrode terminals 16 of the first-layer semiconductor chip 10. Then, in this state, the second-layer semiconductor chip 10 is heated at the first temperature T1 and pressurized with the first load F1 to be temporarily crimped to the first-layer semiconductor chip 10.

Thereafter, similarly, the third-layer semiconductor chip 10 is temporarily crimped onto the second-layer semiconductor chip 10, and the fourth-layer semiconductor chip 10 is temporarily crimped onto the third-layer semiconductor chip 10. (c) of FIG. 5 shows a mode in which the four layers of semiconductor chips 10 are laminated in the region A while being temporarily crimped. A laminate body in which the four semiconductor chips 10 are laminated becomes the chip stack ST in the temporarily crimped state.

When the chip stack ST in the temporarily crimped state can be formed in the region A, the chip stack ST in the temporarily crimped state is also formed in another disposition region 34 in the same procedure. However, at this stage, the chip stack ST in the temporarily crimped state is not formed in the region B but is formed in the region C in order to make the distance between the chip stacks ST in the temporarily crimped state to be the separation distance Dd or more. (a) of FIG. 6 shows a mode in which the chip stacks ST in the temporarily crimped state are formed in two or more disposition regions 34 (the region A and the region C). At this stage, a crimping step for the first time is completed.

After the crimping step is completed, subsequently, the chip stacks ST formed in the temporarily crimped state are permanently crimped sequentially. Specifically, as shown in (b) of FIG. 6, first, the mounting head 122 is heated to the second temperature T2 which is the temperature for permanent crimping. Then, as shown in (b) of FIG. 6, the chip stack ST in the temporarily crimped state is pressurized with the second load F2 by the mounting head 122 heated to the second temperature T2, and the four semiconductor chips 10 are permanently crimped collectively. The second load F2 is not particularly limited as long as the pressing amount of the bumps 18 can be properly maintained.

By being pressed by the mounting head 122 heated to the second temperature T2, the four semiconductor chips 10 forming the chip stack ST are also heated. However, the heating temperature decreases as the distance from the mounting head 122 increases. Specifically, the uppermost-layer (fourth-layer) semiconductor chip 10 is heated to substantially the same temperature as the second temperature T2, but the lowermost-layer (first-layer) semiconductor chip 10 is heated to a lower layer temperature Ta=T2−ΔT, which is less than the second temperature T2 by ΔT. The second temperature T2 is set so that the lower layer temperature Ta becomes a target temperature greater than the melting temperature Tm and the curing start temperature Tt. That is, at the time of permanent crimping, all the four semiconductor chips 10 forming the chip stack ST are heated to a temperature greater than the melting temperature Tm and the curing start temperature Tt.

Each semiconductor chip 10 is heated to above the curing start temperature Tt, whereby the NCF 20 of the semiconductor chip 10 gradually cures. Then, by curing the NCF 20, the semiconductor chip 10 and the crimped body (the substrate 30 or the lower semiconductor chip 10) are firmly fixed mechanically. In addition, the bumps 18 can be melted and glued to the opposite electrode terminals 32 and 16 by being heated to above the melting temperature Tm. Then, in this way, the four semiconductor chips 10 and the substrate 30 become to be in a mounting state in which they are electrically bonded to each other. Then, the step of collectively permanently crimping the four semiconductor chips 10 which form the chip stack ST becomes the permanent crimping step.

However, the heat transferred to the lower layer is also transferred to the vicinity via the substrate 30 (the semiconductor wafer) with a high thermal conductivity. Due to the heat transferred via the substrate 30, other chip stacks ST in the vicinity may be adversely affected. In order to avoid such an adverse effect due to the heat, in the embodiment, the chip stacks ST in the temporarily crimped state are separated by the separation distance Dd or more, which will be described in detail later.

When one chip stack ST can be permanently crimped, then another chip stack ST is also permanently crimped. That is, the permanent crimping is sequentially performed in all of the two or more disposition regions 34 such as the region C and the like. Then, when all the chip stacks ST formed in the temporarily crimped state have all been permanently crimped, subsequently, the temporary crimping step for the second time is performed. That is, the chip stacks ST in the temporarily crimped state are formed in the disposition regions where the chip stacks ST are not formed in the temporary crimping step for the first time, such as the region B and the like in the example of FIG. 6. (c) of FIG. 6 is a diagram showing the mode of the temporary crimping step for the second time. As in the temporary crimping step for the first time, when the chip stacks ST in the temporarily crimped state can be formed in two or more disposition regions, then the permanent crimping step for the second time is performed for permanently crimping these chip stacks ST sequentially. Thereafter, the mounting process is completed by repeating the temporary crimping step and the permanent crimping step until the chip stacks ST can be mounted in all the desired disposition regions.

As is clear from the above description, the embodiment uses the parallel method in which the permanent crimping is continuously performed after the temporary crimping is continuously performed for the two or more disposition regions 34. Therefore, the number of times of switching the temperature of the mounting head 122 can be reduced, as compared with the serial method in which the temporary crimping and the permanent crimping are repeatedly performed for each disposition region 34. As a result, the standby time for temperature rise and fall can be reduced, and the time of the entire mounting process can be significantly reduced.

Figure 7:
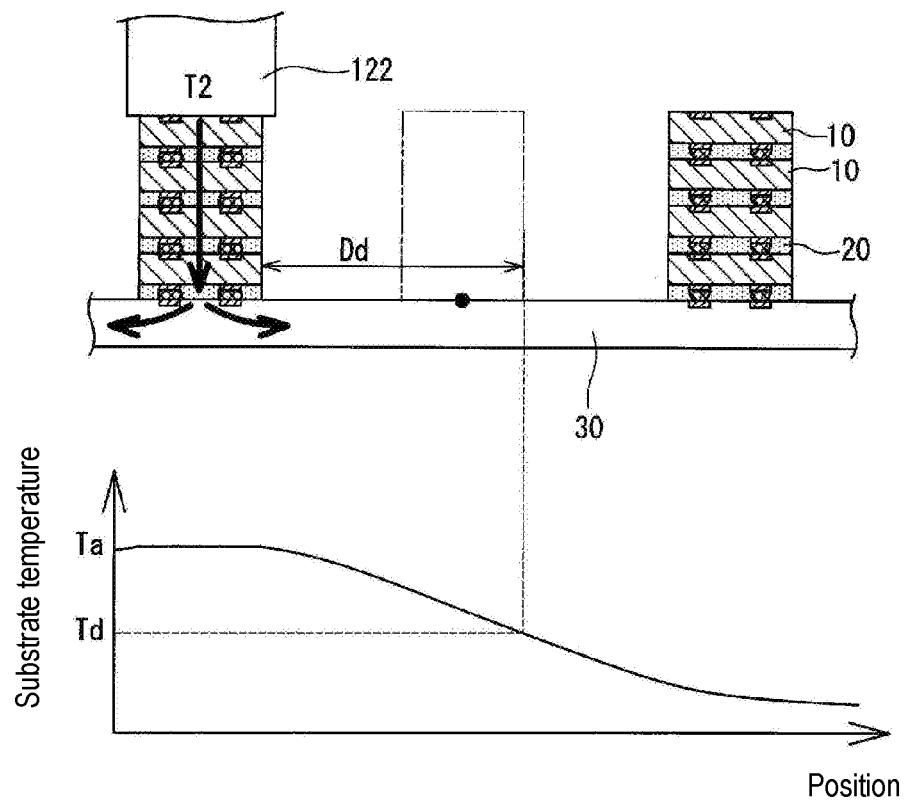
FIG. 7 is a diagram showing a relationship between the mounting of the semiconductor chips and the temperature of the substrate.

By the way, as is clear from the description, in the embodiment, the chip stacks ST in the temporarily crimped state are formed separated from each other by the predetermined separation distance Dd or more. The reason for this configuration will be described with reference to FIG. 7. In FIG. 7, the upper part is an image diagram showing the mounting process of the semiconductor chips 10, and the lower part is a graph showing the surface temperature of the substrate 30.

As shown in FIG. 7 and as previously described, when the top surface of the chip stack ST laminated in the region A is pressurized while being heated by the mounting head 122 heated at the second temperature T2, the semiconductor chip 10 in the lower layer is heated to the temperature Ta sufficiently greater than the curing start temperature Tt of the NCF 20 and the melting temperature Tm of the bumps 18. At this time, the temperature of the substrate 30 in the region A adjacent to the semiconductor chip 10 in the lower layer is also greater than the curing start temperature Tt and the melting temperature Tm. Further, since the substrate 30, which is a semiconductor wafer, has a relatively high thermal conductivity, the heat received from the semiconductor chip 10 in the lower layer is further transferred to the vicinity thereof. As a result, the surface temperature may exceed the curing start temperature Tt and the melting temperature Tm not only in the region A but also in the adjacent region B.

In this case, if the chip stack ST in the temporarily crimped state is present in the region B, the NCF 20 of this chip stack ST starts to cure prior to the permanent crimping, and the bumps 18 start to melt. When the curing of the NCF 20 and the melting of the bumps 18 occur prior to the permanent crimping, a bonding failure between this semiconductor chip 10 and the substrate is caused. In addition, even if the curing of the NCF 20 and the melting of the bumps 18 do not occur, there is a concern that the exposure to a high temperature for a long time may result in an undesirable thermal change.

Therefore, in the embodiment, the separation distance Dd is specified in advance, wherein the separation distance Dd is a distance from the chip stack ST under permanent crimping to a location where the temperature of the substrate 30, the temperature having been raised by the heat for the permanent crimping, becomes less than or equal to a prescribed permissible temperature Td. Then, formation locations of the chip stacks ST are determined so that all the chip stacks ST in the temporarily crimped state are separated from each other by the separation distance Dd or more.

The permissible temperature Td is not particularly limited as long as it is less than or equal to the curing start temperature Tt at which the NCF 20 starts to cure irreversibly and is less than or equal to the melting temperature Tm at which the bumps 18 start to melt. The separation distance Dd is a distance from the chip stack ST under permanent crimping to the location where the surface temperature becomes the permissible temperature Td, but the method of specifying the separation distance Dd is not particularly limited. For example, the user may be prompted to input the separation distance Dd, and a value input by the user may be specified as the separation distance Dd. In this case, the user obtains the separation distance Dd by experiments, simulations and the like in advance.

Further, in another aspect, the control part of the mounting device 100 may specify the separation distance Dd based on mounting conditions. For example, the control part may specify the separation distance Ta which is the temperature of the semiconductor chip 10 in the lower layer of the chip stack ST that is being permanently crimped. Here, the lower layer temperature Ta is an unknown value not detected by a sensor or the like. However, the second temperature T2 which is the temperature of the mounting head 122 at the time of the permanent crimping is set to a temperature so that the lower layer temperature Ta becomes the target temperature which is greater than or equal to the melting temperature Tm and the curing start temperature Tt. Since this target temperature is known in advance, this target temperature can be regarded as the lower layer temperature Ta.

Figure 8:
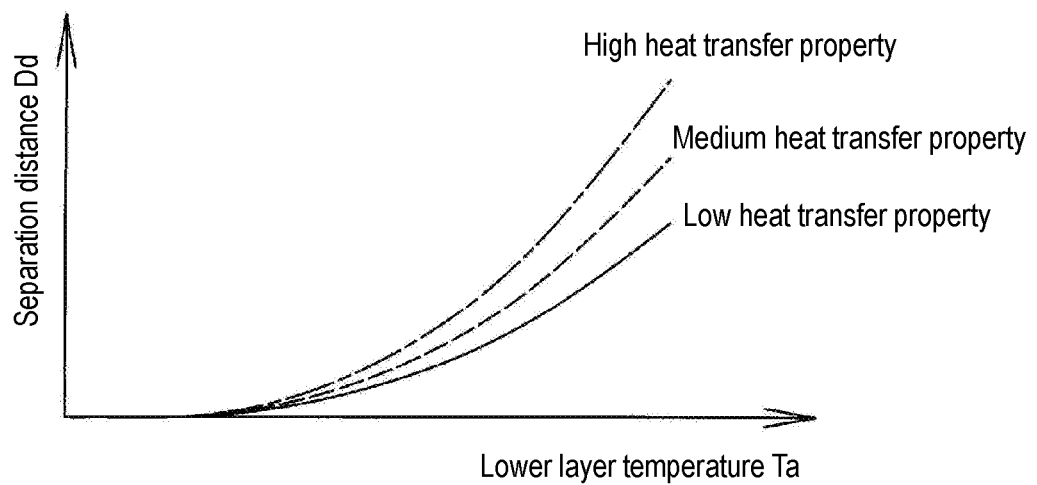
FIG. 8 is a diagram showing an example of a separation distance map.

The control part stores in advance a separation distance map indicating the correlation between the lower layer temperature Ta and the separation distance Dd. FIG. 8 is a diagram showing an example of the separation distance map. The separation distance Dd is 0 when the lower layer temperature Ta is less than or equal to the permissible temperature Td, but as the lower layer temperature Ta rises above the permissible temperature Td, the separation distance Dd also increases. The control part specifies the separation distance Dd by comparing the second temperature T2 actually used at the time of the permanent crimping with the separation distance map.

Further, the separation distance Dd also varies depending on the heat transfer property of the substrate 30. Even if the lower layer temperature Ta is the same, it is conceivable that the higher the heat transfer property of the substrate 30 is, the greater the separation distance Dd is. Therefore, a plurality types of separation distance maps may be prepared according to the heat transfer property of the substrate 30. In FIG. 8, the solid line indicates the separation distance Dd in the case of a low heat transfer property, the dash-dotted line indicates the separation distance Dd in the case of a high heat transfer property, and the broken line indicates the separation distance Dd in the case of a medium heat transfer property.

The heat transfer property of the substrate 30 varies depending on the differences in characteristics such as the shape (thickness), the material and the like of the substrate 30. Therefore, the control part may store in advance heat transfer property data indicating the correlation between the characteristics and the heat transfer property of the substrate 30, and the control part may specify the heat transfer property of the substrate 30 based on the heat transfer property data. FIG. 9 is a diagram showing an example of the heat transfer property data. The control part specifies the heat transfer property of the substrate 30 by comparing the thickness and the material of the substrate 30 actually used with the heat transfer property data.

Further, the separation distance Dd also varies depending on the duration of the permanent crimping and the ambient temperature in the vicinity. Therefore, when the separation distance Dd is specified, in addition to the lower layer temperature Ta and the heat transfer property described above, the duration of the permanent crimping, the ambient temperature and the like may also be taken into consideration. For example, even if the lower layer temperature Ta and the heat transfer property are the same, the separation distance Dd may be set greater as the duration of the permanent crimping is longer and as the ambient temperature is greater.

Furthermore, the method of specifying the separation distance Dd described above is an example and may be changed as appropriate. For example, in the above embodiment, the preset target temperature is treated as the lower layer temperature Ta. However, the lower layer temperature Ta may be estimated based on the second temperature T2, which is the temperature of the mounting head 122 at the time of the permanent crimping, and the number of laminated chips or the height of the chip stack ST.

Next, a method of specifying formation positions of the chip stacks ST in the temporarily crimped state will be described. As described above repeatedly, in the embodiment, the chip stacks ST in the temporarily crimped state are separated from each other by the separation distance Dd or more. In order to satisfy this condition, in the embodiment, the chip stacks ST in the temporarily crimped state are disposed while being spaced by every several disposition regions 34. Specifically, when the disposition pitch of the disposition regions 34 is set as P, the control part specifies an integer N that satisfies $\{(N-1) \times P\} \leq Dd < N \times P$. Then, in the temporary crimping step, the chip stacks ST in the temporarily crimped state are formed with N disposition regions therebetween.

Figure 10:
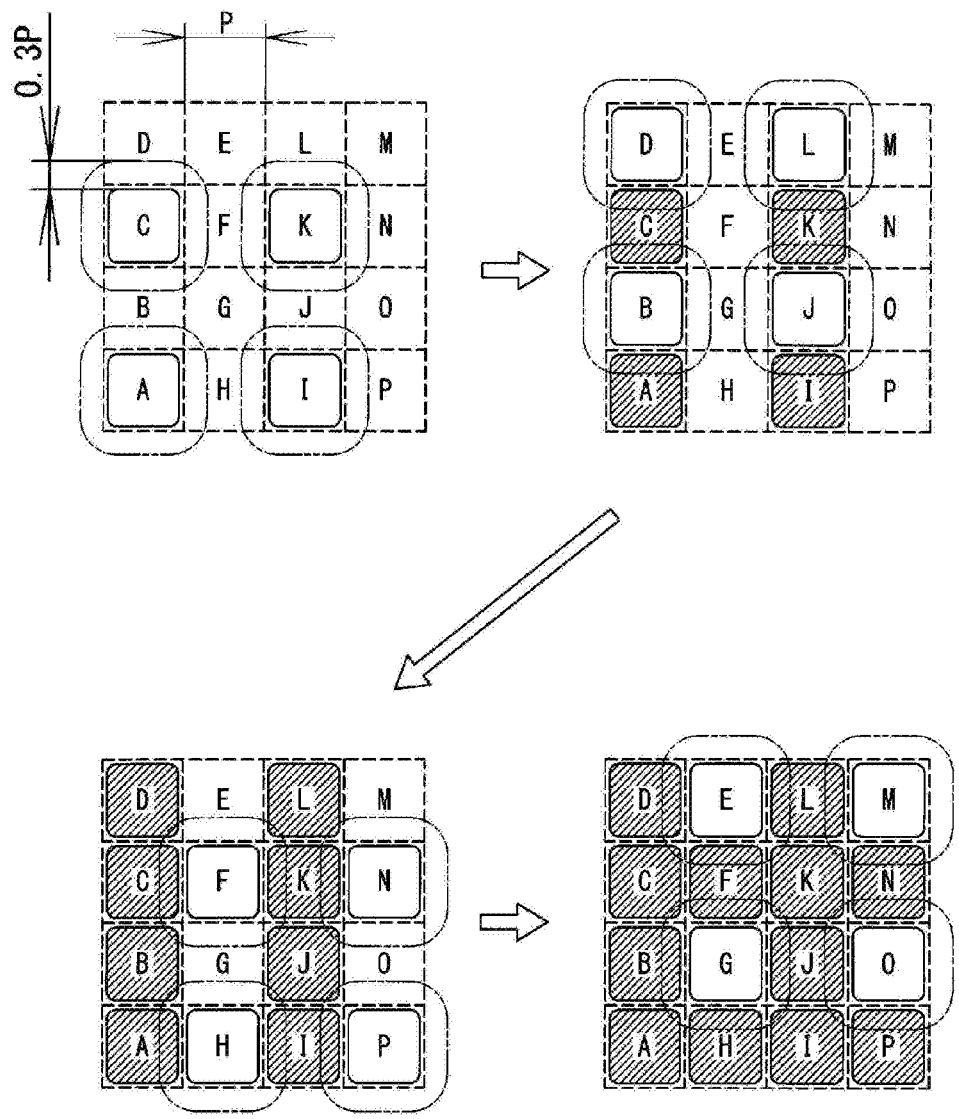
FIG. 10 is a diagram showing an example of formation positions of chip stacks.

This will be described with reference to FIG. 10. FIG. 10 shows a mode in which the plurality of chip stacks ST are formed on the substrate 30 on which 4×4=16 disposition regions 34 are set. In FIG. 10, white rectangles indicate the chip stacks ST in the temporarily crimped state, and hatched rectangles indicate the chip stacks ST after the permanent crimping. Further, for convenience of description, the plurality of disposition regions 34 will be referred to as the region A, the region B, . . . , the region P sequentially in order from the lower left.

In this example, it is assumed that the disposition pitch of the disposition regions 34 is P and that the separation distance Dd is 0.3×P. In this case, since Dd=0.3×P is greater than 0 and less than P, the integer N satisfying $\{(N-1) \times P\} \leq Dd < N \times P$ is "1". Therefore, in this case, the chip stacks ST in the temporarily crimped state are disposed with one disposition region therebetween.

That is, as shown in the upper left of FIG. 10, in the case of forming the chip stack ST in the temporarily crimped state in the region A in the temporary crimping step for the first time, the regions C and I which skip one disposition region 34 in the longitudinal direction and the transverse direction viewed from the region A and the region K which is separated from the regions C and I by one region are also formed with the chip stacks ST in the temporarily crimped state. Then, when the chip stacks ST in the temporarily crimped state can be formed in the regions A, C, K, and I, subsequently, these four chip stacks ST are permanently crimped sequentially. Even though the permanent crimping has been performed, since other chip stacks ST in the temporarily crimped state are not present in the regions where the substrate 30 is at a high temperature (the regions less than the separation distance Dd), undesirable thermal changes such as unintended curing of the NCF 20 and melting of the bumps 18 can be prevented.

In the temporary crimping step for the second time, the chip stacks ST in the temporarily crimped state are formed in the open disposition regions 34. For example, in the case of forming the chip stack ST in the temporarily crimped state in the region B in the temporary crimping step for the second time, the regions D and J which skip one disposition region 34 in the longitudinal direction and the transverse direction viewed from the region B and the region L which is separated from the regions D and J by one region are also formed with the chip stacks ST in the temporarily crimped state. Then, when the chip stacks ST in the temporarily crimped state can be formed in the regions B, D, L and J, subsequently, these four chip stacks ST are permanently crimped sequentially. That is, the permanent crimping step for the second time is performed. At this time, in the vicinity of the chip stack ST being permanently crimped, such as in the regions A and C which are in the vicinity of the chip stack ST in the region B, other chip stacks ST are present. However, since the chip stacks ST in the regions A and C have already been permanently crimped, no problem occurs even if the high temperature is transferred to the chip stacks ST in the regions A and C. In other words, undesirable thermal changes such as unintended curing of the NCF 20 and melting of the bumps 18 can be prevented even in this case. After the crimping step for the second time is completed, the temporary crimping step and the permanent crimping step are repeated thereafter in the same way, and the chip stacks ST are formed in the open regions at an interval of skipping one region.

As described above, in the embodiment, the integer N satisfying $\{(N-1) \times P\} \leq Dd < N \times P$ is specified, and the formation positions of the chip stacks ST in the temporarily crimped state are specified based on the integer N. In addition, such specification of the formation positions may be performed at any time during the performance of the temporary crimping step. Further, in another aspect, the formation positions of the chip stacks ST in the temporarily crimped state may be specified prior to the temporary crimping step for the first time. That is, a map indicating the formation positions of the chip stacks ST for each temporary crimping step may be formed in advance based on the separation distance Dd prior to the temporary crimping step for the first time, and the chip stacks ST in the temporarily crimped state may be formed according to this map in the actual temporary crimping step.

Incidentally, in the above description, an example in which both the temporary crimping and the permanent crimping are performed by one mounting head 122 has been described. However, the mounting head 122 is not necessarily one, and a mounting head for temporary crimping and a mounting head for permanent crimping may both be provided. In this case, the mounting head dedicated to temporary crimping may always be heated to the first temperature T1, and the mounting head dedicated to permanent crimping may always be heated to the second temperature T2. With this configuration, the switching of the temperature of the mounting heads is not required, so the time required for the temperature rise and fall of the mounting heads can be eliminated, and the mounting time can be further reduced.

Further, at this time, the mounting head for permanent crimping may be set to a size that can heat and pressurize (permanently crimp) two or more chip stacks ST simultaneously. For example, as shown in the upper part of FIG. 11, a mounting head 122*a* for permanent crimping may be set to a size that can permanently crimp four chip stacks ST simultaneously. In this case, the chip stacks ST to be permanently crimped simultaneously do not have to be separated by the separation distance Dd, and the chip stacks ST in the temporarily crimped state not to be permanently crimped simultaneously may be separated by the separation distance Dd or more.

Figure 11:
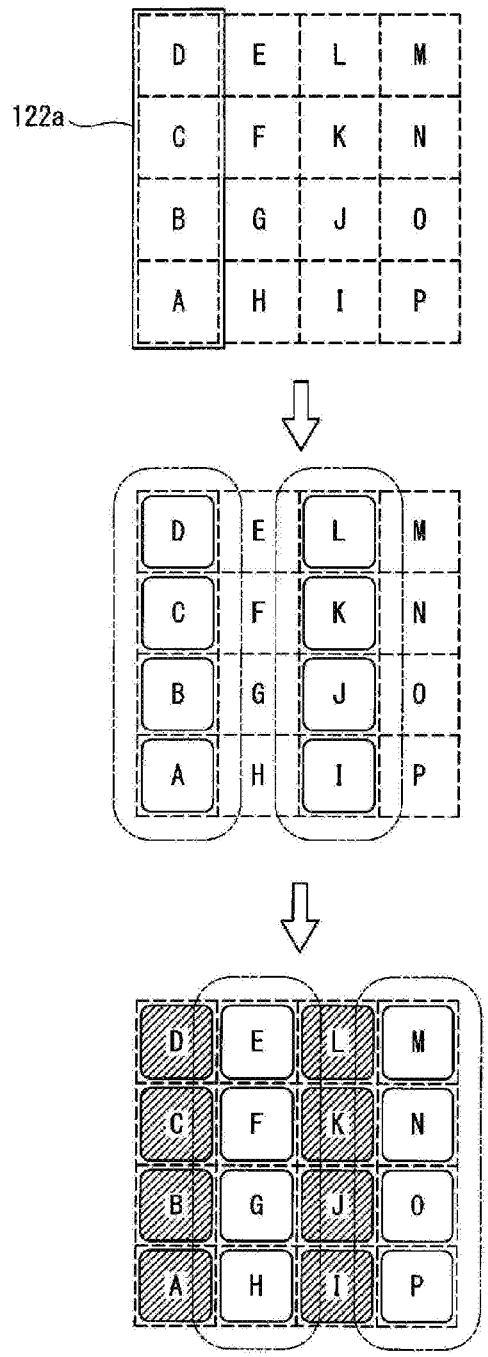
FIG. 11 is a diagram showing another example of formation positions of chip stacks.

For example, in the example of FIG. 11, in the temporary crimping step for the first time, the chip stacks ST in the temporarily crimped state may be formed in the regions L to I separated from the regions A to D by one row (the separation distance Dd or more). Then, in the permanent crimping step for the first time, after the chip stacks ST in the regions A to D are permanently crimped simultaneously, the chip stacks ST in the regions L to I are permanently crimped simultaneously. Then in the temporary crimping step for the second time, the chip stacks ST in the temporarily crimped state are formed in the regions E to H and the regions M to P. In the permanent crimping step for the second time, the chip stacks ST in the regions E to H are permanently crimped simultaneously, and the chip stacks ST in the regions M to P are permanently crimped simultaneously.

As described above, by permanently crimping two or more chip stacks ST simultaneously, the number of times of performing each step can be reduced, and the time of the entire mounting process can be further reduced. Further, in this case, since the chip stacks in the temporarily crimped state not to be permanently crimped simultaneously are separated by the separation distance Dd or more, unintended curing of the NCF 20 and melting of the bumps 18 can be effectively prevented.

In addition, in the above description, each chip stack ST is described as four layers, but the number of lamination in the chip stack ST is not particularly limited as long as it is one or more. Moreover, in the above description, a semiconductor wafer is used as the substrate 30, but other substrates may be used. However, the technique of the embodiment is particularly suitable to a case in which a substrate made of a material with a relatively high thermal conductivity is used.

What is claimed is:

1. A method of manufacturing a semiconductor device in which one or more semiconductor chips are laminated and mounted in a plurality of locations on a substrate, comprising:

a first temporary crimping step and a second temporary crimping step of sequentially laminating the one or more semiconductor chips in each of two or more locations on the substrate while temporarily crimping the one or more semiconductor chips to thereby form chip stacks in a temporarily crimped state; and a first permanent crimping step and a second permanent crimping step of sequentially heating and pressurizing top surfaces of all of the chip stacks formed in the temporarily crimped state to thereby collectively permanently crimp the one or more semiconductor chips which form each of the chip stacks, wherein the method performs the first temporary crimping step, the second temporary crimping step, the first permanent crimping step, and the second permanent crimping at least once until a desired number of the chip stacks are reached, further comprises a specifying step prior to the first temporary crimping step for specifying a separation distance which is a distance from the chip stacks under permanent crimping to a location at which a temperature of the substrate, the temperature having been raised by heating due to the first permanent crimping, becomes less than or equal to a prescribed permissible temperature, in the first temporary crimping step, forms the chip stacks in the temporarily crimped state to be separated from each other by the separation distance or more, in the second temporary crimping step, forms the chip stacks in the temporarily crimped state between chip stacks in a permanent crimped state without the separation distance, in the first permanent crimping step, permanently crimps the chip stacks which are in the temporarily crimped state and are formed separated from each other by the separation distance or more, and in the second permanent crimping step, permanently crimps the chip stacks which are in the temporarily crimped state and are between the chip stacks in the permanent crimped state.

2. The method of manufacturing a semiconductor device according to claim 1, wherein the specifying step specifies the separation distance based on mounting conditions of the semiconductor chips.

3. The method of manufacturing a semiconductor device according to claim 2, wherein a lower layer temperature which is a temperature of lowermost layers of the chip stacks when the first permanent crimping step is performed is comprised, in the specifying step, the separation distance is specified so that the separation distance becomes greater as the lower layer temperature is greater.

4. The method of manufacturing a semiconductor device according to claim 1, wherein a thermosetting resin is provided on an end surface at one side of the semiconductor chip in a laminating direction for fixing the semiconductor chip to the substrate or to another semiconductor chip mounted adjacent to the one side in the laminating direction, and the permissible temperature is less than a curing start temperature at which the thermosetting resin starts to cure irreversibly.

5. The method of manufacturing a semiconductor device according to claim 1, further comprising:
a map forming step of forming a map indicating formation positions of the plurality of chip stacks based on the specified separation distance,
wherein in the first temporary crimping step, the plurality of chip stacks in the temporarily crimped state are formed according to the map.

6. The method of manufacturing a semiconductor device according to claim 1, wherein
a plurality of disposition regions in which the chip stacks are disposed further set to be arranged in a lattice shape at a prescribed pitch P on the substrate,
the specifying step, after specifying the separation distance and when setting the separation distance as Dd, further specifies an integer N satisfying $\{(N-1) \times P\} \leq Dd < N \times P$, N is an integer $\geq 1$, and
in the first temporary crimping step, the chip stacks in the temporarily crimped state are formed with N disposition regions therebetween.

7. The method of manufacturing a semiconductor device according to claim 1, wherein the substrate is a semiconductor wafer.

8. A method of manufacturing a semiconductor device, comprising:
a first temporary crimping step and a second temporary crimping step of sequentially laminating one or more semiconductor chips in each of two or more locations on a substrate while temporarily crimping the one or more semiconductor chips to thereby form chip stacks in a temporarily crimped state; and
a permanent crimping step of repeating twice or more a process of simultaneously heating and pressurizing top surfaces of the two or more chip stacks in the temporarily crimped state and simultaneously performing permanent crimping to change all of the chip stacks in the temporarily crimped state formed in the temporary crimping step to a permanently crimped state, wherein the method performs the first temporary crimping step and the second temporary crimping step at least once and repeats the permanent crimping step twice or more until a desired number of the chip stacks are reached, further comprises a specifying step prior to the first temporary crimping step for specifying a separation distance which is a distance from the chip stacks under permanent crimping to a location at which a temperature of the substrate, the temperature having been raised by heating due to the permanent crimping, becomes less than or equal to a prescribed permissible temperature, in the first temporary crimping step, forms the chip stacks in the temporarily crimped state not to be permanently crimped simultaneously to be separated from each other by the separation distance or more, and in the second temporary crimping step, forms the chip stacks in the temporarily crimped state between chip stacks in a permanent crimped state without the separation distance.

* * * * *